United States Patent
Brosnihan et al.

(10) Patent No.: US 7,816,165 B2
(45) Date of Patent: Oct. 19, 2010

(54) METHOD OF FORMING A DEVICE BY REMOVING A CONDUCTIVE LAYER OF A WAFER

(75) Inventors: Timothy J. Brosnihan, Natick, MA (US); Robert E. Sulouff, Jr., Chesapeake, VA (US); John M. Sledziewski, Hanover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/350,986

(22) Filed: Jan. 9, 2009

(65) Prior Publication Data

US 2009/0114954 A1    May 7, 2009

Related U.S. Application Data

(62) Division of application No. 11/049,205, filed on Feb. 2, 2005, now Pat. No. 7,491,566.

(60) Provisional application No. 60/543,059, filed on Feb. 9, 2004.

(51) Int. Cl.
   *H01L 21/00* (2006.01)

(52) U.S. Cl. .............................. 438/48; 438/61; 438/68; 347/54; 347/69; 361/700

(58) Field of Classification Search .................. 438/48, 438/61, 68; 347/54, 68, 69; 361/700
See application file for complete search history.

(56) References Cited

U.S. PATENT DOCUMENTS

| | | | |
|---|---|---|---|
| 4,744,863 A | 5/1988 | Guckel et al. | |
| 4,838,088 A | 6/1989 | Murakami | |
| 4,853,669 A | 8/1989 | Guckel et al. | |
| 4,996,082 A | 2/1991 | Guckel et al. | |
| 5,204,286 A | 4/1993 | Doan | |
| 5,573,679 A | 11/1996 | Mitchell et al. | |
| 6,696,364 B2 * | 2/2004 | Gelmi et al. | 438/704 |
| 6,709,089 B2 * | 3/2004 | Koeda | 347/54 |
| 6,711,793 B2 * | 3/2004 | Sumi | 29/25.35 |
| 6,743,654 B2 * | 6/2004 | Coffa et al. | 438/52 |
| 6,756,248 B2 | 6/2004 | Ikeda et al. | |
| 7,146,014 B2 | 12/2006 | Hannah | |
| 2002/0093038 A1 * | 7/2002 | Ikeda et al. | 257/213 |

FOREIGN PATENT DOCUMENTS

EP    1207378 B1    8/2007

OTHER PUBLICATIONS

International Search Report dated Jun. 6, 2005.
* cited by examiner

*Primary Examiner*—Phuc T Dang
(74) *Attorney, Agent, or Firm*—Sunstein Kann Murphy & Timbers LLP

(57) ABSTRACT

A method of forming a MEMS device provides a wafer having a base with a conductive portion. The wafer also has an intermediate conductive layer. After it provides the wafer, the method adds a diaphragm layer to the wafer. The method removes at least a portion of the intermediate conductive layer to form a cavity between the diaphragm layer and the base. At least a portion of the diaphragm layer is movable relative to the base. After it forms the cavity, the method seals the cavity.

13 Claims, 5 Drawing Sheets

METHOD OF FORMING A DEVICE BY REMOVING A CONDUCTIVE LAYER OF A WAFER

CROSS-REFERENCE TO RELATED APPLICATIONS

This application is a divisional of application Ser. No. 11/049,205 filed Feb. 2, 2005, now U.S. Pat. No. 7,491,566, which claims priority from U.S. Provisional Application No. 60/543,059, filed Feb. 9, 2004, entitled, "PRESSURE SENSOR," the disclosures of which are incorporated by reference herein in their entireties.

FIELD OF THE INVENTION

The invention generally relates to MEMS devices and, more particularly, the invention relates to MEMS pressure sensors.

BACKGROUND OF THE INVENTION

Microelectromechanical systems ("MEMS," hereinafter "MEMS devices") are used in a wide variety of applications. For example, MEMS devices currently are implemented as microphones to convert audible signals to electrical signals, as gyroscopes to detect pitch angles of airplanes, and as pressure sensors to detect changes in pressure. In simplified terms, such MEMS devices typically have a movable structure suspended from a substrate, and associated circuitry (either on or off chip) that both senses movement of the suspended structure and delivers the sensed movement data to one or more external devices (e.g., an external computer). The external device processes the sensed data to calculate the property being measured (e.g., pressure).

To form pressure sensors, many prior art processes form a cavity between a movable diaphragm and a base. To form the cavity, various processes known to the inventors remove an insulator material, which requires HF etches of a sacrificial oxide. Such etches, however, can create fabrication inefficiencies. Specifically, HF etches can harm metallization and pre-formed circuits, while causing stiction in compliant structures. In addition, such processes are relatively slow and thus, often have difficulty clearing out large cavities.

SUMMARY OF THE INVENTION

In accordance with one aspect of the invention, a method of forming a MEMS device provides a wafer having a base, a first conductive layer, a second conductive layer, and an intermediate conductive layer. After it provides the wafer, the method removes at least a portion of the intermediate conductive layer to form a cavity between the first and second conductive layers. At least a portion of the first conductive layer is movable relative to the base to form a diaphragm, while the second conductive layer is substantially immovable relative to the base. After it forms the cavity, the method seals the cavity.

In illustrative embodiments, the first and second conductive layers form a variable capacitor that fluctuates as the first conductive layer moves. Moreover, the cavity may be sealed to have a cavity pressure that is less than atmospheric pressure. Among other materials, the first and second conductive layers may be a silicon based material (e.g., silicon, polysilicon, or silicon germanium).

The method may add circuitry to the wafer before removing the intermediate conductive layer. Among other things, the circuitry may be capable of detecting movement of the diaphragm relative to the second conductive layer. The method may remove the intermediate layer in a number of ways, such as by applying a dry gas phase etch to the intermediate conductive layer. In addition, the first conductive layer, intermediate conductive layer, and second conductive layer may be formed from substantially the same material. In that case, the wafer may have a barrier layer of different material between the first conductive layer and the intermediate conductive layer to facilitate removal of the intermediate layer.

In accordance with another aspect of the invention, a method of forming a MEMS device provides a wafer having an intermediate conductive layer and a base with a conductive portion. The method then adds a diaphragm layer to the wafer, and removes at least a portion of the intermediate conductive layer to form a cavity between the diaphragm layer and the base. At least a portion of the diaphragm conductive layer is movable relative to the base. The method then seals the cavity.

Among other things, the base includes a support substrate that supports a conductive layer that is part of the conductive portion. In addition, the method may dice the wafer to form a plurality of like devices. Circuitry may be added to the wafer before removing at least a portion of the intermediate conductive layer. Alternatively, circuitry could be added at a later time.

In some embodiments, the wafer has additional material supported by the intermediate conductive layer. In that case, the intermediate conductive layer may be between the additional material and the conductive portion of the base. The method thus may remove the additional material before adding the diaphragm conductive layer.

In accordance with another aspect of the invention, a method of forming a pressure sensor provides a wafer having an intermediate conductive layer and a base with a conductive portion. The method removes at least a portion of the intermediate conductive layer to form a cavity, and then seals the cavity.

The method may add a diaphragm layer to the wafer, at least a portion of which is movable relative to the base after the cavity is formed. Alternatively, the wafer has a diaphragm layer when provided. Moreover, the wafer may have circuitry when provided, or be free of circuitry when provided.

BRIEF DESCRIPTION OF THE DRAWINGS

The foregoing and advantages of the invention will be appreciated more fully from the following further description thereof with reference to the accompanying drawings wherein.

DESCRIPTION OF ILLUSTRATIVE EMBODIMENTS

Illustrative embodiments of the invention fabricate a MEMS device (e.g., a pressure sensor) from existing layers of a multilayered wafer. Such embodiments typically use one or more conductive layers as a sacrificial layer. Details of illustrative embodiments are discussed below.

Figure 1:
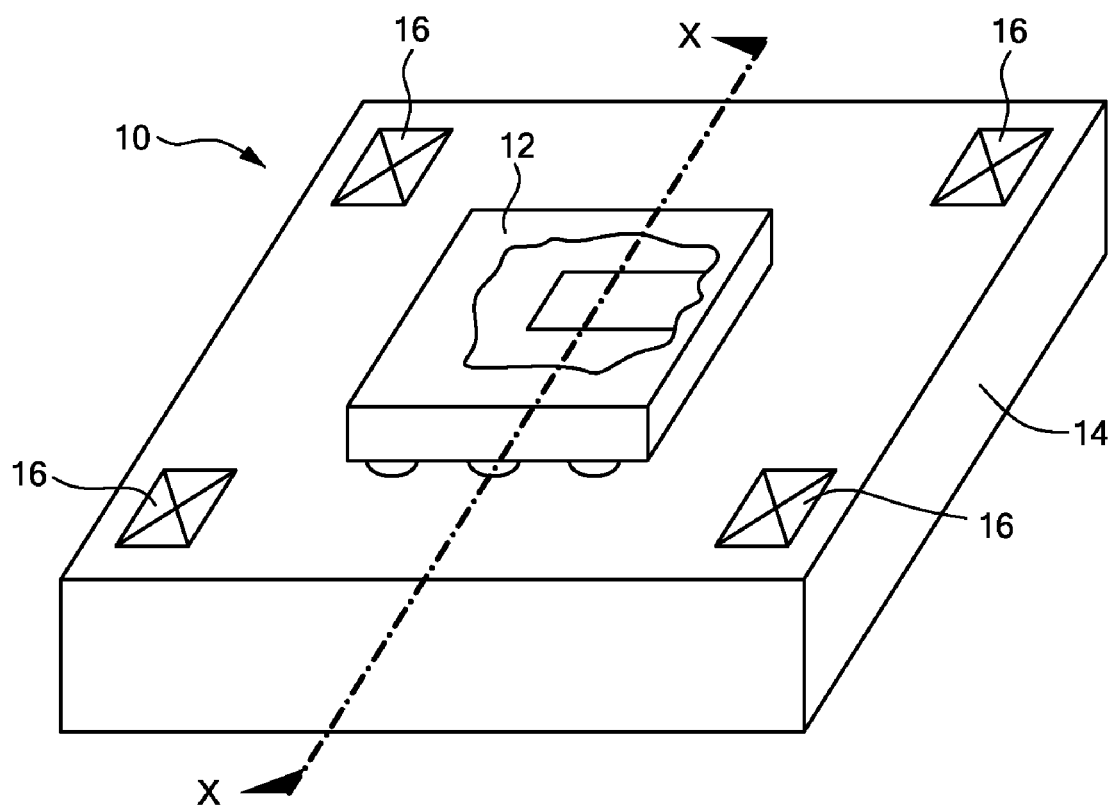
FIG. 1 schematically shows a packaged integrated circuit or chip that may be produced in accordance with illustrative embodiment of the invention.

FIG. 1 schematically shows an exemplary use of a chip 10 produced in accordance with illustrative embodiments of the invention. Specifically, the chip 10 in this embodiment is a MEMS device having both circuitry 11 and movable structure 13 (see FIGS. 3, 4A-4C, and 5A-5D). The MEMS device 10 illustratively is formed on a silicon wafer and packaged within a conventional package 12. The package 12 is coupled with a circuit board 14 having interconnects 16 to electrically communicate with an external device, such as a computer.

Since it is implemented as a MEMS device, the chip 10 may execute any conventionally known functionality commonly implemented by a MEMS device, such as a pressure sensor. Although the chip 10 is discussed as a MEMS pressure sensor, principles of illustrative embodiments can apply to other chips or integrated circuits, such as MEMS inertial sensors and microphones. Accordingly, discussion of a pressure sensor is exemplary and not intended to limit the scope of various embodiments of the invention.

It should be noted, however, that discussion of MEMS devices is exemplary. Accordingly, principles of illustrative embodiments may apply to other types of chips or integrated circuits.

Figure 2:
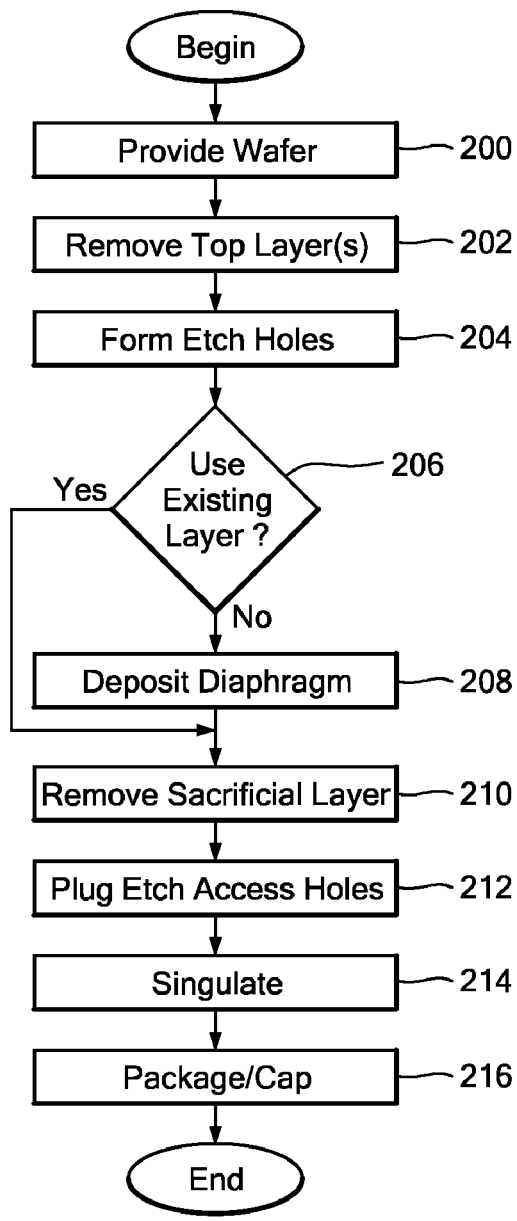
FIG. 2 shows a process of forming a pressure sensor in accordance with illustrative embodiments of the invention.
Figure 3:
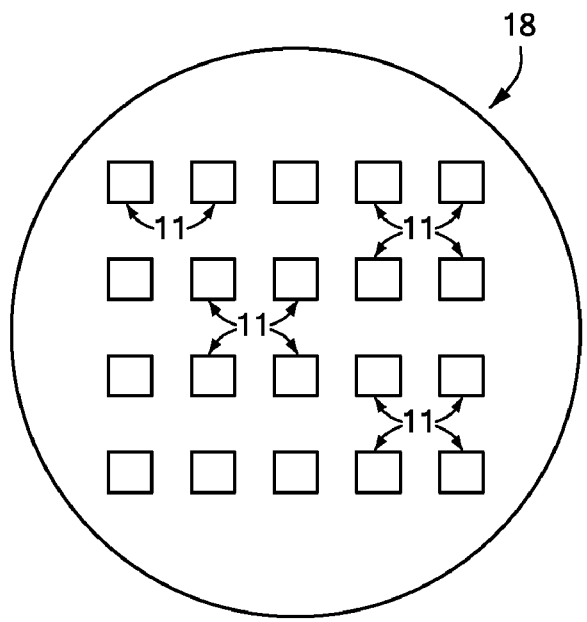
FIG. 3 schematically shows a top view of a wafer that may be used in the process shown in FIG. 2.

FIG. 2 schematically shows a process of fabricating the chip 10 shown in FIG. 1. The process begins at step 200, which provides a foundry wafer to be processed into a plurality of pressure sensors. FIG. 3 schematically shows an exemplary foundry wafer 18, which has an array of previously fabricated sets of circuits. Of course, the circuits illustratively are preconfigured to cooperate with the MEMS structure 13 to be formed on the wafer 18. For example, the circuitry 11 may be conventional CMOS circuitry implementing pressure sensor functionality. Each set of circuits illustratively is for a single chip 10 that will be formed after a subsequent singulation step. As known by those skilled in the art, such a wafer typically has a plurality of conductive layers separated by one or more insulator layers 24.

It should be noted that identifying the wafer 18 as a "foundry" wafer is not intended to limit the scope of various embodiments. In fact, some embodiments of the invention use generic multi-layered wafers having a plurality of conductors formed from the same or different materials. In addition, among other things, any of the conductive layers may be formed from some non-insulating material, such as a semiconductor (doped or undoped polysilicon) or metal. Moreover, although the wafer 18 shown in FIG. 3 has prefabricated circuitry 11, some embodiments do not form any circuitry on the wafer 18 before step 200.

Figure 4A:
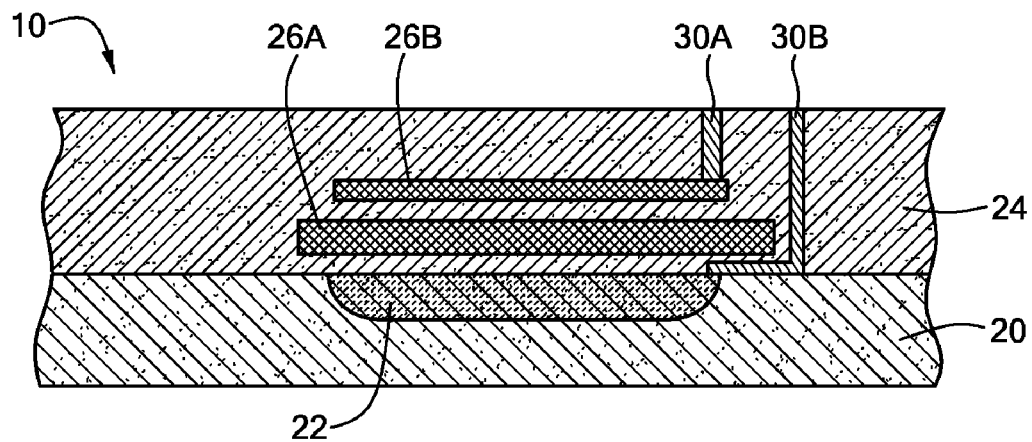
FIGS. 4A-4C schematically show details of the process shown in FIG. 2 in accordance with an embodiment that uses an internal layer as a diaphragm.
Figure 4B:
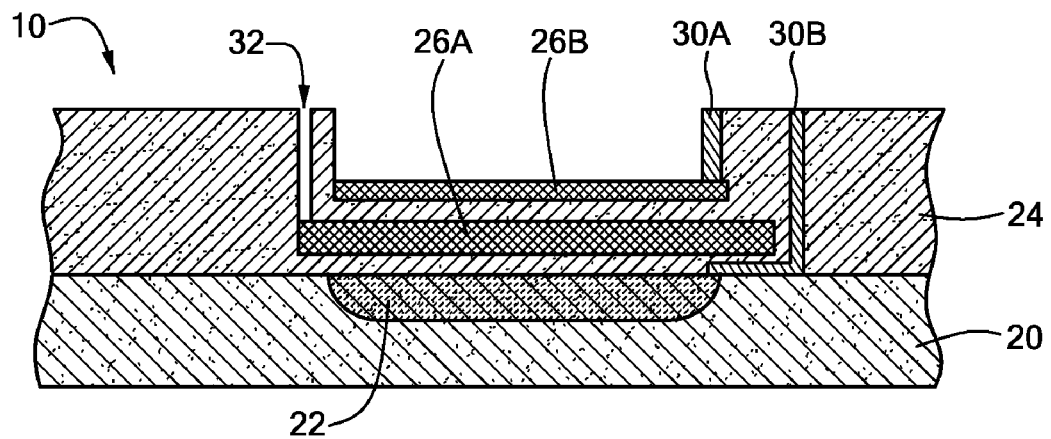
Figure 4C:
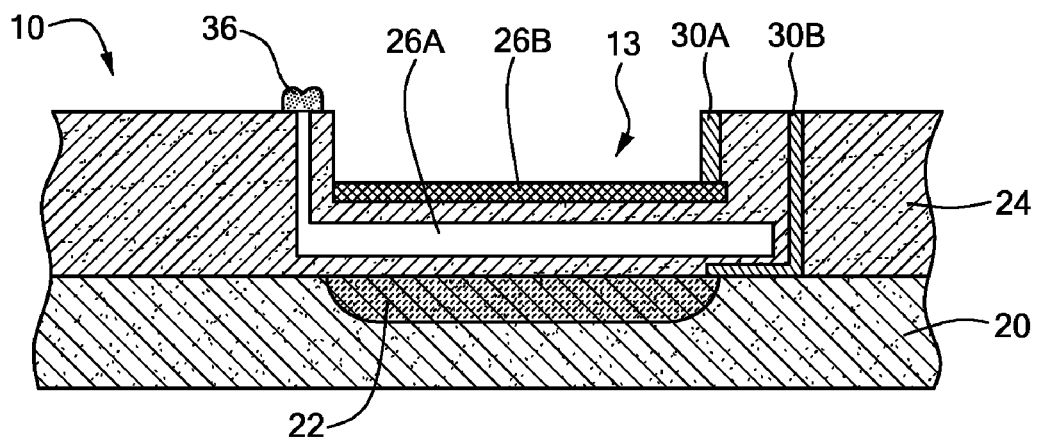

FIGS. 4A-4C and 5A-5D illustrate the wafer 18 at various stages of the process shown in FIG. 2. Each set of figures, however, shows a different embodiment. In particular, FIGS. 4A-4C show simplified cross-sectional views of one embodiment that does not require a deposited conductive material to act as a diaphragm, while FIGS. 5A-5D show simplified cross-sectional views of another embodiment that requires a deposited layer to act as a diaphragm. To simplify this discussion, however, the circuitry 11 is not shown in any of FIG. 4A-4C or 5A-5D. In fact, it should be noted that these figures are exemplary and not intended to encompass all embodiments of the invention. Accordingly, the wafer 18 may have additional layers or components not shown in the figures.

More specifically, FIG. 4A schematically shows an embodiment in which the wafer 18 has a base layer 20 with a conductive region 22, and an insulator 24 containing two additional conductive layers 26A and 26B. The insulator 24 may be considered to form various insulator layers 24 between the conductive layers 26A and 26B and base 20. In addition, the wafer 18 also has conductive interconnects 30A and 30B (e.g., formed from metal) that respectively permit electrical communication for the conductive layer 26B and conductive region 22. In illustrative embodiments, the conductive layers 26A and 26B are formed from metal or a silicon based material (e.g., doped or undoped polysilicon or silicon germanium). Moreover, the conductive region 22 of the base layer 20 may be doped silicon. In place of or in addition to the conductive region 22 of the base layer 20, the wafer 18 may have an additional conductive layer (not shown) abutting or near the top surface of the base layer 20.

Figure 5A:
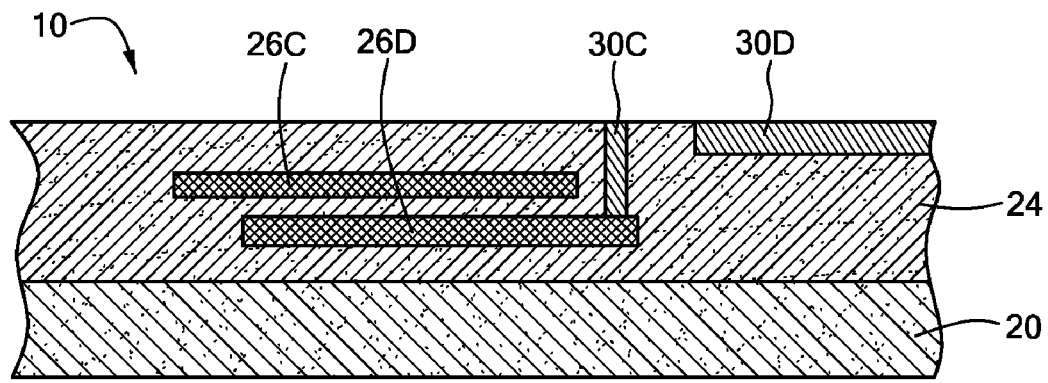
FIGS. 5A-5D schematically show details of the process shown in FIG. 2 in accordance with an embodiment that requires a deposited diaphragm.
Figure 5B:
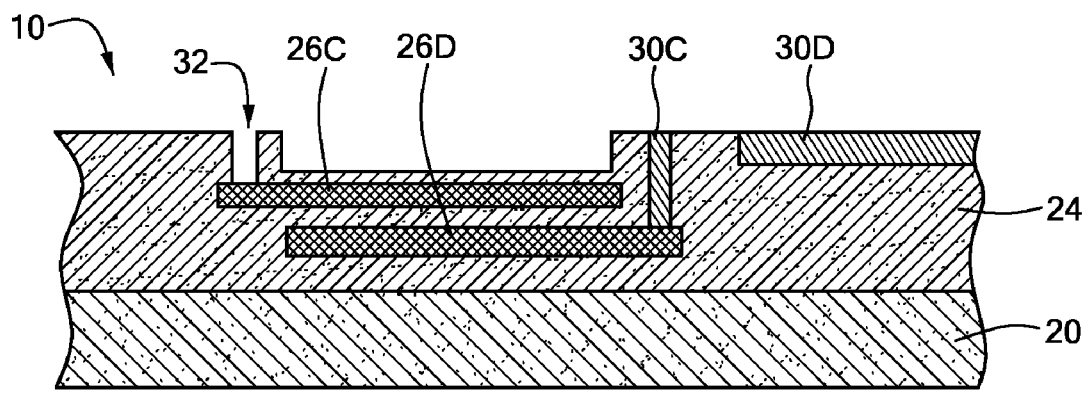

FIG. 5A schematically shows a similar embodiment of the provided wafer 18, which has a base layer 20 and an insulator 24 also containing two additional conductive layers 26C and 26D. In a manner similar to the above discussed embodiment, the insulator 24 may be considered to form various insulator layers 24 between the conductive layers 26C and 26D and the base 20. The wafer 18 also has a first conductive interconnect 30C (e.g., formed from metal) that permits electrical communication for one of conductive layers 26D, and a second metal interconnect 30D that permits electrical communication for a subsequently deposited layer (discussed below). Also similar to the above discussed embodiment, the conductive layers 26C and 26D within the insulator may be formed from metal or a silicon based material.

The process continues to step 202, which removes some of the top layers of the wafer 18. For example, illustrative embodiments remove circuit dielectrics (e.g., insulator layers 24) down to a specified level. For example, in FIGS. 4B and 5B, the insulator material respectively between the top wafer surface and the top conductive layers 26B and 26C is removed. The embodiment in FIG. 4B, however, exposes the top surface of the top conductive layer 26B, while the embodiment in FIG. 5B leaves a thin layer of insulator material 24 on the top conductor 26C.

Before, during, or after execution of step 202, the process forms etch holes 32 that each extend to one (or more, as the case may be) of the conductive layers in the wafer 18 (step 204). For the embodiment shown in FIG. 4B, the etch holes 32 extend to the lower conductive layer 26A. For the embodiment shown in FIG. 5B, however, the etch holes 32 extend to the top conductive layer 26C.

Figure 5C:
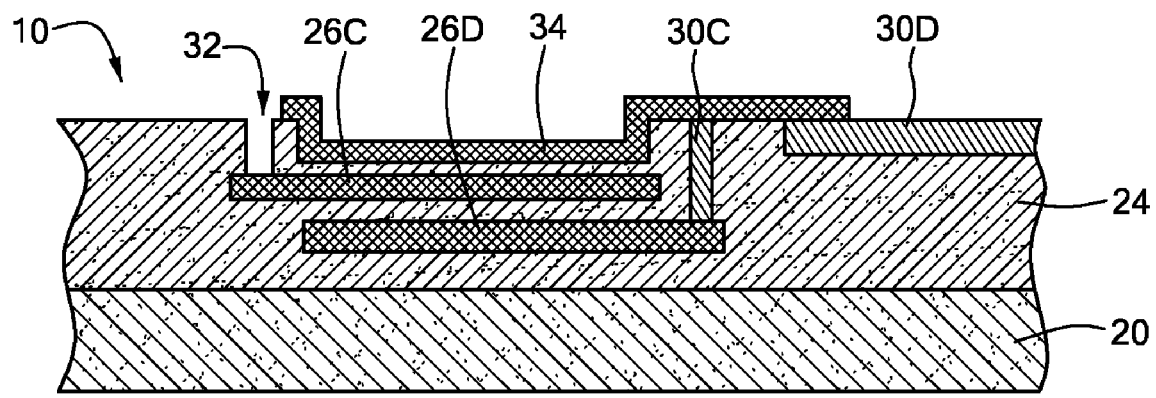
Figure 5D:
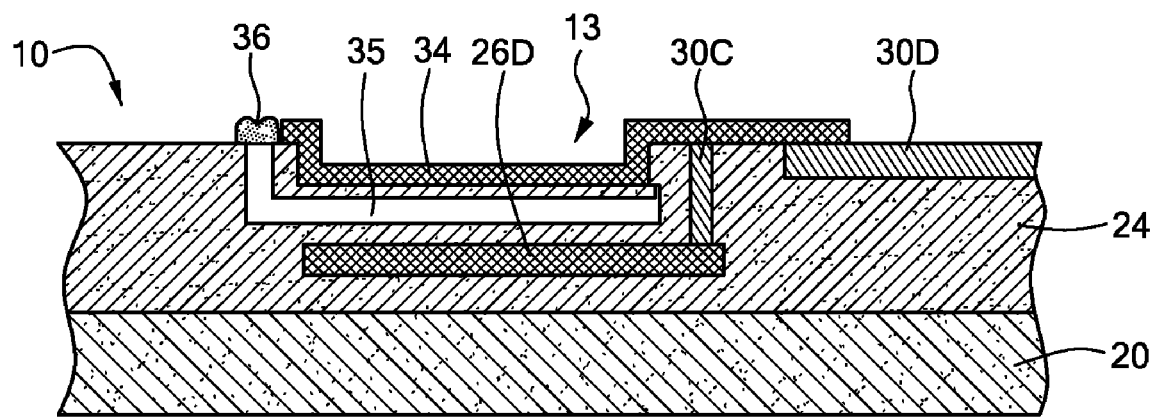

It then is determined at step 206 if an existing layer is to be used as the diaphragm. As noted above, this is an important distinction between the embodiments shown in FIGS. 4A-4C and 5A-5D. If existing layers are not to be used in this manner, then the process deposits and patterns a deposited layer 34 in the previously removed regions of the wafer 18 (step 208). For example, as shown in FIG. 5C, the deposited layer 34 is deposited on the insulator layer 24 remaining after the top layers were removed. As shown in FIG. 5C, the deposited layer 34 is deposited to make electrical contact with the second metal interconnect 30D, thus permitting electrical communication with circuit elements. In illustrative embodiments, the deposited layer 34 is a flexible and conductive material. Among other things, it may be a metal or silicon-based material, such as silicon-germanium or polysilicon (doped or undoped).

Returning to decision step 206, if an existing layer is to be used as a diaphragm, the process skips step 208 and also continues to step 210. Specifically, at step 210, the process removes one or more of the conductive layers from the wafer 18. Because they are removed, such a conductive layer (referred to as the "sacrificial layer") consequently should not serve as an interconnect for electronic components or MEMS structure 13.

For the embodiment shown in FIG. 4C, the process removes the lower conductive layer 26A only. This is in contrast to the embodiment shown in FIG. 5D, in which the process removes the upper conductive layer 26C only. In either case, removal of the sacrificial layer produces a cavity 35 into which the diaphragm may flex. Specifically, the top conductive layer 26B forms the diaphragm in the embodiment shown in FIG. 4C, while the deposited layer 34 forms a diaphragm in the embodiment shown in FIG. 5D. The diaphragms of the two embodiments each form a variable capacitor with the lower conductive layer 26D and conductive region 22, respectively. Accordingly, the lower conductive layer 26D and conductive region 22 respectively form substantially stationary plates of their variable capacitors, while the diaphragms (i.e., conductive layer 26B and deposited layer 34) respectively form movable plates for their capacitors. During use, the amount of diaphragm flexure, and thus changing capacitance, determines the pressure reading.

Illustrative embodiments remove the sacrificial layer by means of a dry gas phase etch. For example, xenon difluoride may be applied to the sacrificial layers that are formed from polysilicon. The insulator material around the sacrificial layer prevents the xenon difluoride from affecting other conductive layers. The insulator material therefore acts as a barrier for the other conductive layers. Such a barrier should not be necessary if any of the other conductive layers is not sensitive to the xenon difluoride (e.g., if the sacrificial layer is formed from a different material than that forming the other conductive layers). If the sacrificial layers are formed from metal, however, illustrative embodiments may use a wet metal etch.

After removing the sacrificial layers, the process seals the cavity 35 by depositing plugs 36 over the etch holes 32 (step 212). This seal illustratively is hermetic. To those ends, the process may deposit a nitride layer over portions of the top surface of the wafer 18. At a minimum, this nitride layer should at least partially fill (and thus seal) the etch holes 32. In some embodiments, this nitride layer also covers the diaphragm, electrical contacts, and other top facing components. It nevertheless may be advantageous or necessary to remove the nitride from various of those components, such as the electrical contacts. In addition, this nitride layer also may serve as an in-situ cap for other portions of the wafer 18.

In illustrative embodiments, the process seals the etch holes 32 in an environment having a pressure that is lower than atmospheric pressure. For example, the etch holes 32 may be sealed in a vacuum. Consequently, during anticipated use, the pressure within the cavity 35 should be lower than external pressures and thus, be relatively sensitive to pressure changes. Those skilled in the art can select an appropriate cavity pressure based upon the desired sensitivity of the pressure sensor.

At this point in the process, circuitry is added to those embodiments that do not yet have circuitry. As noted above, the circuitry may be conventionally known circuitry for the given application and formed in a conventional manner. In fact, such embodiments may add circuitry at any point in the process before the chip 10 is packaged. Alternatively, some embodiments may have no circuitry. Accordingly, such embodiments rely upon off-chip circuitry to perform their function.

After the etch holes 32 are plugged, the process continues to step 214, which singluates the wafer 18. Conventional sawing/dicing processes may be used. Finally, the process ends by packaging the chip 10 in a conventional package 12 (step 216). A number of different package types may be used, such as ceramic packages or premolded packages.

Accordingly, this process forms a plurality of individual MEMS pressure sensors from a single multilayer wafer. The physical location of the circuitry 11 and MEMS structure 13 can be selected based upon the requirements of the application. For example, the circuitry 11 may circumscribe the MEMS structure 13. As a second example, the MEMS structure 13 may be on one portion of the chip 10, while the circuitry 11 may be on another portion of the chip 10.

It should be noted that the process discussed with regard to FIG. 2 is not intended to be complete with regard to all possible steps for producing a chip 10. Instead, the process highlights various important steps for implementing illustrative embodiments of the invention. In addition, some of the steps of the process can be executed in a different order, or at substantially the same time. For example, the embodiment shown in FIGS. 4A-4C may form the etch holes 32 before removing the top layers. In fact, that embodiment also may remove the sacrificial layer before removing the top layers. As a further example, the diaphragm may be deposited (step 208) before forming the etch holes 22 (step 204).

Accordingly, illustrative embodiments of the invention can more efficiently form an integrated circuit, such as a MEMS pressure sensor, from existing layers of a multilayered wafer. In fact, the wafer can already have prefabricated circuitry that cooperates with subsequently formed structure. Moreover, to improve processing efficiency and ultimate product robustness, illustrative embodiments form internal cavities (or release MEMS structure) by using conductive layers as sacrificial material.

Although the above discussion discloses various exemplary embodiments of the invention, it should be apparent that those skilled in the art can make various modifications that will achieve some of the advantages of the invention without departing from the true scope of the invention.

What is claimed is:

1. A method of forming a MEMS device, the method comprising:
    providing a wafer having a base and an insulator having an upper conductive layer, a lower conductive layer, and a dielectric layer on top of the upper conductive layer;
    removing at least a portion of the dielectric layer in regions above the upper conductive layer;
    adding a diaphragm layer to the wafer in at least a portion of the removed regions;
    removing at least a portion of the upper conductive layer to form a cavity between the diaphragm layer and the base, at least a portion of the diaphragm layer being movable relative to the base; and
    sealing the cavity.

2. The method as defined by claim 1 further including dicing the wafer to form a plurality of like devices.

3. The method as defined by claim 1 further comprising adding circuitry to the wafer before removing at least a portion of the upper conductive layer.

4. The method as defined by claim 3 wherein the circuitry is capable of detecting movement of the diaphragm relative to the lower conductive layer.

5. The method as defined by claim 1 wherein the diaphragm layer and the lower conductive layer form a variable capacitor that fluctuates as the portion of the diaphragm layer moves relative to the base.

6. The method as defined by claim 1 wherein sealing comprises sealing the cavity to have a cavity pressure that is less than atmospheric pressure.

7. The method as defined by claim 1 wherein the diaphragm layer and the lower conductive layer comprise a silicon based material.

8. The method as defined by claim 1 wherein removing includes applying a dry gas phase etch to the upper conductive layer.

9. The method as defined by claim 1 wherein the lower conductive layer, the upper conductive layer, and the diaphragm layer are formed from substantially the same material, the wafer having a barrier layer of different material between the lower conductive layer and the upper conductive layer.

10. The method as defined by claim 1 wherein the wafer has circuitry when provided.

11. The method as defined by claim 1 wherein the wafer is free of circuitry when provided.

12. The method as defined by claim 1 wherein the upper conductive layer comprises a semiconductor.

13. The apparatus formed by the method defined by claim 1.

* * * * *